(12) United States Patent
Chen et al.

(10) Patent No.: US 10,090,804 B2
(45) Date of Patent: Oct. 2, 2018

(54) CONCENTRATOR PHOTOVOLTAIC MODULE AND THE ALIGNMENT DEVICE AND METHOD THEREOF

(71) Applicant: INSTITUTE OF NUCLEAR ENERGY RESEARCH, ATOMIC ENERGY COUNCIL, EXECUTIVE YUAN, R.O.C., Taoyuan (TW)

(72) Inventors: Chun-Yi Chen, Taoyuan (TW); Yueh-Mu Lee, Taoyuan (TW); Zun-Hao Shih, Taoyuan (TW); Yi-Ya Huang, Taoyuan (TW); Hwen-Fen Hong, Taoyuan (TW)

(73) Assignee: Institute of Nuclear Energy Research, Atomic Energy Council, Executive Yuan, Taoyuan (TW)

( * ) Notice: Subject to any disclaimer, the term of this patent is extended or adjusted under 35 U.S.C. 154(b) by 0 days.

(21) Appl. No.: 15/865,422

(22) Filed: Jan. 9, 2018

(65) Prior Publication Data

US 2018/0131317 A1 May 10, 2018

Related U.S. Application Data

(62) Division of application No. 15/279,823, filed on Sep. 29, 2016.

(51) Int. Cl.
*H02S 50/15* (2014.01)
*G01B 11/14* (2006.01)
(Continued)

(52) U.S. Cl.
CPC .............. *H02S 50/15* (2014.12); *G01B 11/14* (2013.01); *G01B 11/26* (2013.01); *G02B 7/003* (2013.01);
(Continued)

(58) Field of Classification Search
CPC .......... H02S 30/10; H02S 40/22; H02S 50/00; H02S 50/10; H02S 50/15; G02B 27/32; G02B 27/34; G02B 27/36; G02B 27/62; G02B 19/00; G02B 19/0009; G02B 19/0042; G02B 19/0047; G02B 19/0052; G02B 19/0057; G02B 19/0061; G02B 19/0066; G02B 19/0076; G02B 7/003;
(Continued)

(56) References Cited

U.S. PATENT DOCUMENTS

| 6,594,084 B1* | 7/2003 | Border | G02B 3/0012 356/401 |
| 8,194,331 B2* | 6/2012 | Shin | F24J 2/085 136/243 |

(Continued)

*Primary Examiner* — Gordon J Stock, Jr.
(74) *Attorney, Agent, or Firm* — Rosenberg, Klein & Lee

(57) ABSTRACT

The present invention discloses a concentrator photovoltaic module and the alignment device and method thereof. A laser source is disposed on a top surface of an alignment device at a tilt angle. According to the optical alignment points on a circuit board, the circuit board and the concentrating lens can be aligned and thus completing assembling a concentrator photovoltaic module. The alignment device and method for concentrator photovoltaic module requires no optically inactive region to complete alignment. Thereby, the utilization of the sunlight and the output power efficiency of the concentrator photovoltaic module can be enhanced.

6 Claims, 4 Drawing Sheets

(51) Int. Cl.
  *G01B 11/26* (2006.01)
  *G02B 7/00* (2006.01)
  *H01L 31/054* (2014.01)
  *H02S 40/22* (2014.01)
  *H02S 30/10* (2014.01)

(52) U.S. Cl.
  CPC .......... *H01L 31/0543* (2014.12); *H02S 30/10* (2014.12); *H02S 40/22* (2014.12)

(58) Field of Classification Search
  CPC ........ G02B 7/004; G02B 7/005; G01B 11/14; G01B 11/26; G01B 11/27; G01B 11/272; H01L 31/054; H01L 31/0543; H01L 31/0547; H01L 31/0549
  USPC ..... 136/246, 247, 290, 349; 356/138, 139.1, 356/150, 399–401; 33/286
  See application file for complete search history.

(56) References Cited

U.S. PATENT DOCUMENTS

| | | | |
|---|---|---|---|
| 9,116,260 B2 * | 8/2015 | Goto | G02B 7/00 |
| 2003/0117482 A1 * | 6/2003 | Border | B23K 26/0648 347/224 |
| 2008/0037141 A1 * | 2/2008 | Tom | F24J 2/10 359/813 |
| 2009/0116013 A1 * | 5/2009 | Tom | G01B 11/27 356/399 |
| 2010/0011565 A1 * | 1/2010 | Zawadzki | B23K 26/0876 29/592.1 |
| 2010/0218804 A1 * | 9/2010 | Shin | H01L 31/0543 136/246 |
| 2011/0283517 A1 * | 11/2011 | Shin | H01L 31/0543 29/464 |
| 2012/0298179 A1 * | 11/2012 | Shin | H01L 31/048 136/246 |

* cited by examiner

CONCENTRATOR PHOTOVOLTAIC MODULE AND THE ALIGNMENT DEVICE AND METHOD THEREOF

REMARKS: CROSS-REFERENCE TO RELATED APPLICATION

This application is a Divisional application of U.S. patent application Ser. No. 15/279,823, filed on 29 Sep. 2016, currently pending, which is incorporated by reference.

FIELD OF THE INVENTION

The present invention relates generally to a concentrator photovoltaic module and the alignment device and method thereof, and particularly to a concentrator photovoltaic module and the alignment device and method thereof using oblique light source.

BACKGROUND OF THE INVENTION

The subject of renewable energy development has attracted worldwide attention. In particular, the solar energy industry is developing very rapidly. On one hand, the emphasis is put on reducing the fabrication cost of solar cells. On the other hand, endeavors are devoted to optimizing the utilization of solar energy as well as the conversion efficiency of solar cells. Popularization of solar energy is being promoted.

Solar cells can be classified into silicon, compound, and organic solar cells. In compound solar cells, the III-V compound solar cells, which include the III-V compounds gallium arsenide (GaAs), indium gallium arsenide (InGaAs), and indium gallium phosphide (InGaP), have the highest conversion efficiency. Presently, III-V compounds with different materials have been stacked to form multi junction solar cells with an extended absorption spectrum of the sunlight. Compared with silicon solar cells, the conversion efficiency of solar energy is improved significantly.

III-V solar cells occupy smaller area and have higher conversion efficiency. By assembling with a concentrating lens, a concentrator photovoltaic module can be given. By using the concentrating lens, the sunlight is concentrated on the solar cells with a small area for generating power and increasing the power generating efficiency. A concentrator photovoltaic module mainly comprises a concentrating lens, a solar cell, a circuit board, and a module frame. The solar cell is combined with the circuit board and is called the receiver. In general, a Fresnel lens with 1000-times concentration is adopted. Nonetheless, because the focal point of the concentrating lens has to fall on the solar cells before the concentrator photovoltaic module can concentrate light, a sun tracker should be used to drive the module to orient to the direction of the sun.

In addition, during the presses of assembling the concentrator photovoltaic module, precise optical alignment must be adopted for focusing the sunlight on the solar cells and ensuring power generating efficiency. Considering deflection occurs when the light passes through the concentrating lens, an optically inactive region is disposed on the concentrating lens according to the prior art. It means that a region without the concentrating lens is reserved. When the light passes through the optically inactive region, no reflection occurs. Instead, the light will illuminate on the circuit board perpendicularly. Then, by moving the circuit board, a laser spot is aimed at an optical alignment point and thus completing optical alignment of the module. Although optical alignment can be performed effectively, the sunlight incident to the optically inactive region cannot be reflected to the solar cells for generating power, resulting in waste of the solar energy.

In order to expand the area of a concentrator photovoltaic module for receiving the sunlight and fully utilizing the solar energy by increasing the output power performance of the photovoltaic module, a novel optical alignment method and device should be developed for replacing the optically inactive region.

SUMMARY

An objective of the present invention is to provide an alignment device for a concentrator photovoltaic module. A laser source is disposed on a top surface at a tilt angle. By using the device in assembling a contractor photovoltaic module, no optically inactive region is required. Thereby, the waste of the incident sunlight can be avoided.

Another objective of the present invention is to provide an alignment method for a concentrator photovoltaic module. A laser source at a tilt angle is used to illuminate a circuit board a concentrating lens. By observing the spot of the laser source falls at a first optical alignment point and a second optical alignment point correctly, the alignment of the circuit boards and the concentrating lens can be performed.

Still another objective of the present invention is to provide an alignment method for a concentrator photovoltaic module. A laser source at a tilt angle is used to illuminate a circuit board a concentrating lens. By using a first laser receiver and a second laser receiver to receive signals, the alignment of the circuit boards and the concentrating lens can be performed.

A further objective of the present invention is to provide a concentrator photovoltaic module. The length of a concentrating lens and the length of the top of a photovoltaic module frame are identical. Thereby, the light incident to the concentrator photovoltaic module can be concentrated to the solar cells via the concentrating lens and thus enhancing the utilization of the sunlight.

In order to achieve to above objective, the present invention disclose an alignment device for concentrator photovoltaic module, which comprises a base, a support member, and a laser source. The support member is disposed on the base and an accommodating space is formed in the support member. Besides, the laser source is disposed on a top surface of the support member at a tilt angle.

The alignment method for concentrator photovoltaic module using the above alignment device comprises steps of: disposing a photovoltaic module frame inside the accommodating space of the alignment device; disposing a circuit board at the bottom of the photovoltaic module frame; disposing a laser source at the alignment device at a tilt angle, illuminating the circuit board using the laser source, and adjusting the position of the circuit board so that the spot of the laser source falls at a first optical alignment point; disposing a concentrating lens on the top of the module frame; and using the laser source to illuminate the concentrating lens, and adjusting the position of the concentrating lens so that the spot of the oblique laser source falls at a second optical alignment point. Then the assembly of the concentrator photovoltaic module is completed.

A first laser receiver and a second laser receiver can be further disposed on the circuit board. The spots of the laser source fall on the first laser receiver and the second laser receiver for ensuring reception of signals. Then the assembly of the concentrator photovoltaic module is completed.

According to an embodiment of the present invention, the tilt angle is calculated according to the curvature and the optical theories of the concentrating lens.

According to an embodiment of the present invention, before the step of disposing the photovoltaic module frame, calculate a first alignment coordinate and a second alignment coordinate according to the curvature of the concentrating lens and the position of the solar cells, and disposed a first optical alignment point and a second optical alignment point according to the first alignment coordinate and the second alignment coordinate, respectively.

According to an embodiment of the present invention, before the step of disposing the photovoltaic module frame, disposed a first laser receiver and a second laser receiver on the circuit board according to the first alignment coordinate and the second alignment coordinate.

According to an embodiment of the present invention, the concentrating lens is a plano-convex lens, a biconvex lens, a paraboloidal lens, or a Fresnel lens.

According to an embodiment of the present invention, the length of the concentrating region of the concentrating lens and the length of the top of the photovoltaic module frame are identical.

DETAILED DESCRIPTION

In order to make the structure and characteristics as well as the effectiveness of the present invention to be further understood and recognized, the detailed description of the present invention is provided as follows along with embodiments and accompanying figures.

A concentrator photovoltaic module is assembled by a concentrating lens and III-V solar cells. A general application adopts a Fresnel lens and GaAs solar cells. The principle of a concentrator photovoltaic module is to concentrate the sunlight onto III-V solar cells using a concentrating lens and thus increasing the utilization of the solar energy. Because the area required by III-V solar cells is smaller than that required by silicon solar cells, the manufacturing cost can be lowered.

In the structure of a concentrator photovoltaic module, a solar cell and a circuit board form a photovoltaic receiver. Because the energy source of a concentrator photovoltaic module relies on accurately focusing the sunlight on the photovoltaic receiver, during the assembling process, a precise optical alignment system is required for adjusting the relative positions of the concentrating lens and the photovoltaic receiver.

In the optical alignment method and device according to the prior art, a region without optical curvature is reserved on the concentrating lens of a photovoltaic module. This region is perpendicular to the optical alignment point. Thereby, the sunlight can illuminate straight to the optical alignment point through the region and completing optical alignment. Because the region owns no optical curvature, the light incident to the photovoltaic module via the region will not deflect to the photovoltaic receiver. Accordingly, the region is an optically inactive region.

The present embodiment provides an alignment device and method for concentrator photovoltaic module. No optically inactive region is required, and hence solving the problem of wasting the incident sunlight in the optically inactive region. Accordingly, the utilization of the solar energy can be improved.

Figure 1:
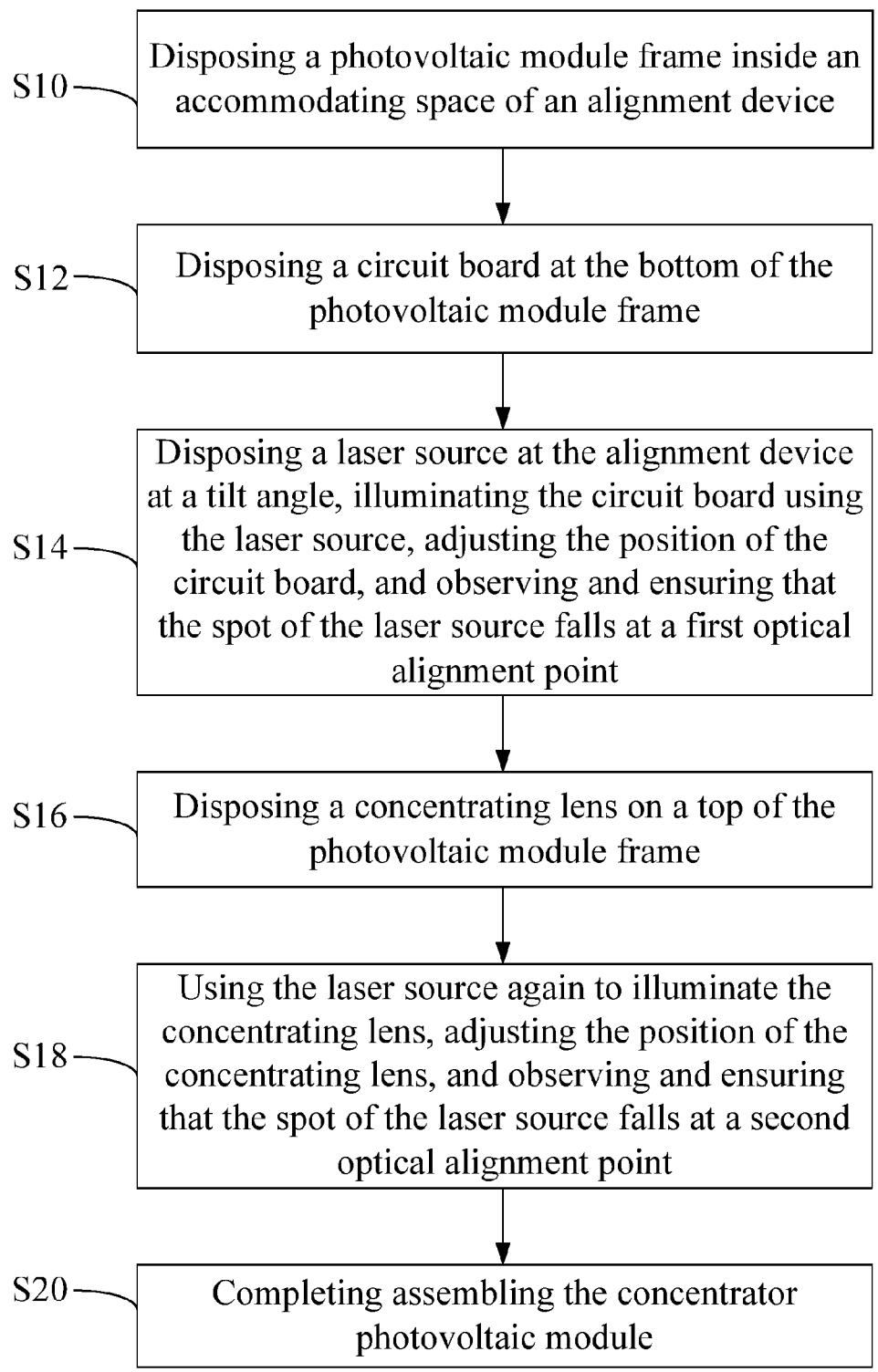
FIG. 1 shows the flowchart of the present invention.

Please refer to FIG. 1, which shows the flowchart of the present invention. The alignment method for concentrator photovoltaic module comprises the following steps:

S10: Disposing a photovoltaic module frame inside an accommodating space of an alignment device;

S12: Disposing a circuit board at the bottom of the photovoltaic module frame;

S14: Disposing a laser source at the alignment device at a tilt angle, illuminating the circuit board using the laser source, adjusting the position of the circuit board, and observing and ensuring that the spot of the laser source falls at a first optical alignment point;

S16: Disposing a concentrating lens on a top of the photovoltaic module frame;

S18: Using the laser source again to illuminate the concentrating lens, adjusting the position of the concentrating lens, and observing and ensuring that the spot of the oblique laser source falls at a second optical alignment point; and S20: Completing assembling the concentrator photovoltaic module.

Figure 2:
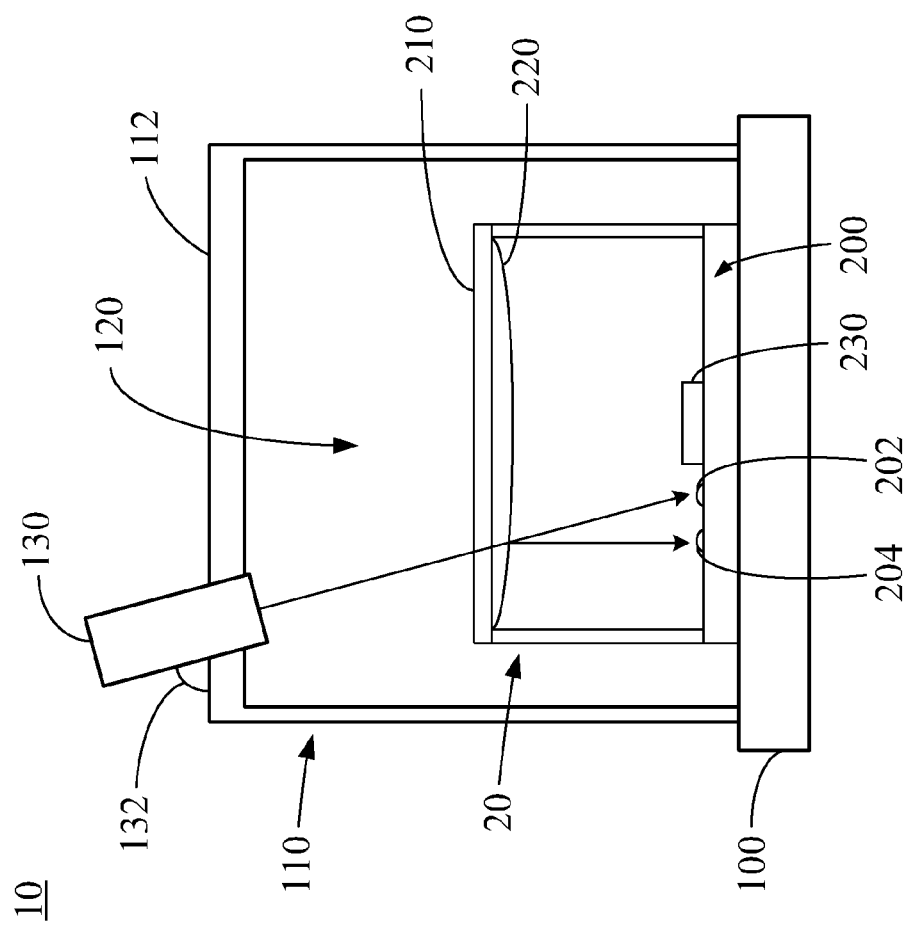
FIG. 2 shows a schematic diagram of the device according to the first embodiment of the present invention.

Please refer to FIG. 2, which shows a schematic diagram of the device according to the first embodiment of the present invention. As shown in the figure, an alignment device 10 comprises a base 100, a support member 110, a top surface 112, and a laser source 130. The support member 110 is disposed on the base 100. An accommodating space 120 is formed in the support member 110. In addition, the laser source 130 is disposed on the top surface 112 of the support member 110 at a tilt angle 132.

During the process of assembling a concentrator photovoltaic module, a photovoltaic module frame 20, a circuit board 200, and a concentrating lens 220 are placed inside the accommodating space 120. Besides, the circuit board 200 further includes a first optical alignment point 202, a second optical alignment point 204, and a photovoltaic receiver 230.

Please refer to FIGS. 1 and 2 concurrently. During the process of assembling the concentrator photovoltaic module, the alignment method for concentrator photovoltaic module according to the present invention is adopted. The method comprises steps of:

S10: Disposing the photovoltaic module frame 20 inside the accommodating space 120 of the alignment device 10;

S12: Disposing the circuit board 200 at the bottom of the photovoltaic module frame 20;

S14: Disposing a laser source 130 at the alignment device 20 at a tilt angle 132, illuminating the circuit board 200 using the laser source 130, adjusting the position of the circuit board 200, and observing and ensuring that the spot of the laser source 130 falls at the first optical alignment point 201, where the tile angle 132 of the laser source 130 is calculated according to optical theories and the curvature of the concentrating lens 220 and to the deflection angle of the light source after passing through the concentrating lens 220;

S16: Disposing the concentrating lens 220 on a top 210 of the photovoltaic module frame 20;

S18: Using the laser source 130 to illuminate the concentrating lens 130, adjusting the position of the concentrating lens 220, and observing and ensuring the that laser source 130 falls at the second optical alignment point 204; and S20: Completing assembling the concentrator photovoltaic module.

Before executing the alignment method for concentrator photovoltaic module as described above, a first alignment coordinate and a second alignment coordinate are calculated according to optical theories and the curvature of the concentrating lens 220. Then the first optical alignment point 202 is disposed on the circuit board 200 corresponding to the first alignment coordinate, and the second optical alignment point 204 is disposed on the circuit board 200 corresponding to the second alignment coordinate.

Next, the second embodiment of the concentrator photovoltaic module according to the present invention will be described. Please refer to FIG. 3, which shows a schematic diagram of the device according to the second embodiment of the present invention. As shown in the figure, an alignment device 10 comprises a base 100, a support member 110, a top surface 112, and a laser source 130. The support member 110 is disposed on the base 100. An accommodating space 120 is formed in the support member 110. In addition, the laser source 130 is disposed on the top surface 112 of the support member 110 at a tilt angle 132.

During the process of assembling a concentrator photovoltaic module, a photovoltaic module frame 20, a circuit board 200, and a concentrating lens 220 are placed inside the accommodating space 120. Besides, the circuit board 200 further includes a first laser receiver 2022, a second laser receiver 2042, and a photovoltaic receiver 230.

While aligning using the alignment method and device according to the second embodiment of the present invention, the differences with the first embodiment are described as follows:

S14: Disposing a laser source 130 at the alignment device 20 at a tilt angle 132, illuminating the circuit board 200 using the laser source 130, adjusting the position of the circuit board 200 so that the spot of the laser source 130 falls at the first laser receiver 2022, and the first laser receiver 2022 receiving signals for ensuring the alignment of the circuit board 200; and S18: Using the laser source 130 to illuminate the concentrating lens 130, adjusting the position of the concentrating lens 220 so that the spot of the laser source 130 falls at the second laser receiver 2042, and the second laser receiver 2042 receiving signals for ensuring the alignment of the concentrating lens 220. The rest steps are identical to those according to the first embodiment. Hence, the details will not be described again.

Figure 4:
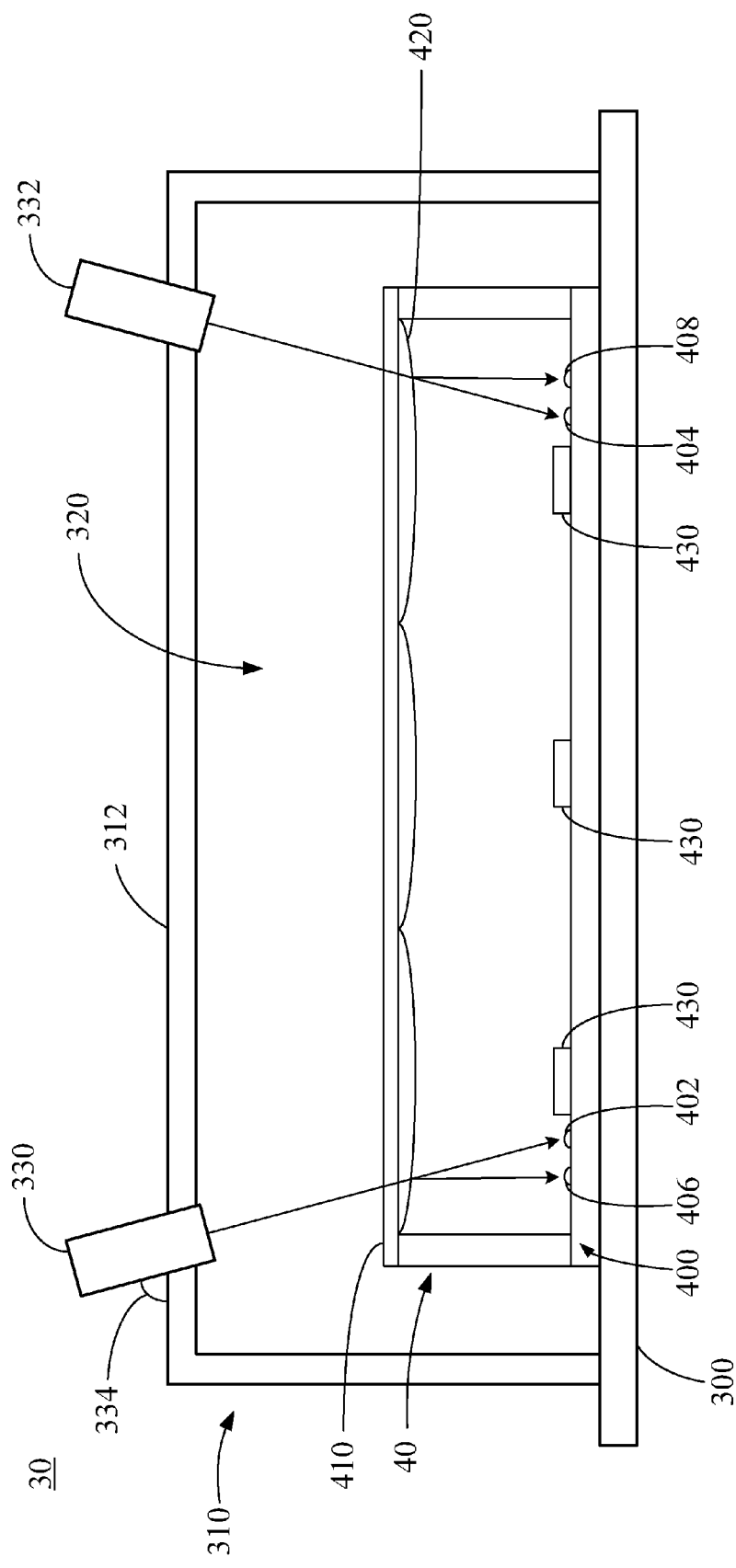
FIG. 4 shows a schematic diagram of the device according to the third embodiment of the present invention.

The alignment method for concentrator photovoltaic module according to the present invention can also be applied to an array-type concentrator photovoltaic module. Please refer to FIG. 4, which shows a schematic diagram of the device according to the third embodiment of the present invention. As shown in the figure, an alignment device 10 comprises a base 300, a support member 310, and a top surface 312. The support member 310 is disposed on the base 300. An accommodating space 320 is formed in the support member 310. In addition, a first laser source 330 and a second laser source 332 are disposed on the top surface 312 at a tilt angle 334.

During the process of assembling a photovoltaic module frame 40, a circuit board 300, and a concentrating lens array 420 are placed inside the accommodating space 320 sequentially. Besides, the circuit board 400 further includes a first optical alignment point 402, a first optical alignment point 404, a second optical alignment point 406, a second optical alignment point 408, and a plurality of photovoltaic receivers 430.

Figure 3:
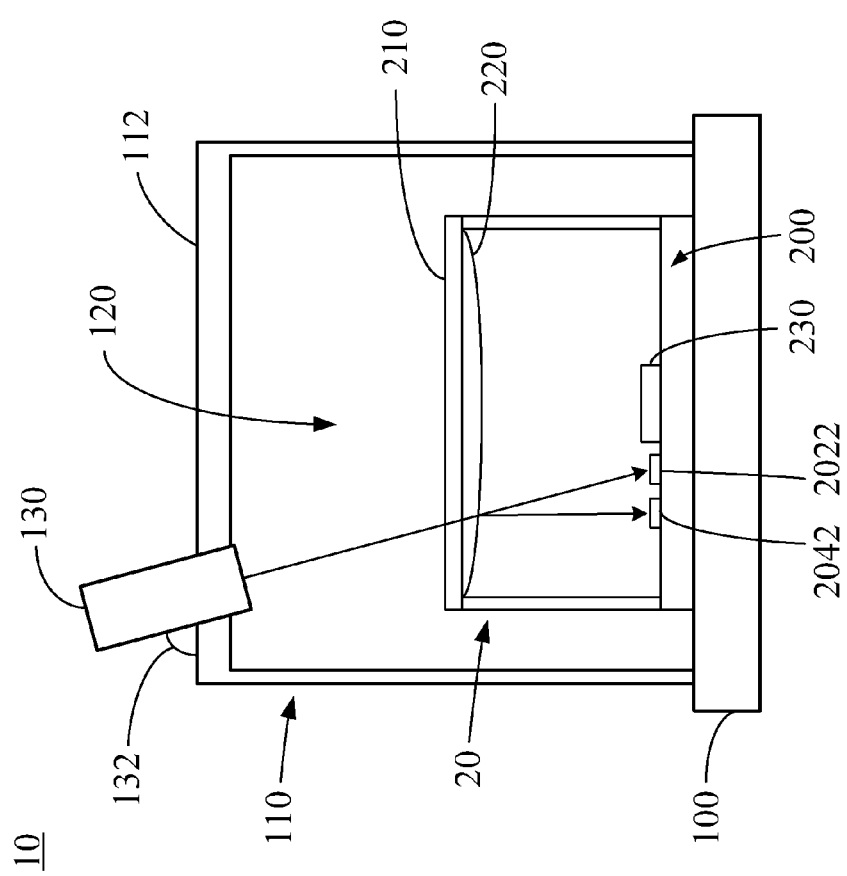
FIG. 3 shows a schematic diagram of the device according to the second embodiment of the present invention.

Please refer to FIGS. 1 and 3 for the steps of assembling the array-type concentrator photovoltaic module. The differences with the first embodiment are the following steps S14 and S18:

S14: Using the first laser source 330 and the second laser source 332 to illuminate the circuit board 400, adjusting the position of the circuit board 400, observing and ensuring that the first laser source 330 falls at the first optical alignment point 402, observing and ensuring that the second laser source 332 falls at the first optical alignment point 404, and completing aligning the circuit board 400; and S18: Using the first laser source 330 and the second laser source 332 to illuminate the concentrating lens array 420, adjusting the position of the concentrating lens array 420 so that the spot of the first laser source 330 falls at the second optical alignment point 408 and the spot of the second laser source 332 falls at the second optical alignment point 408, and completing aligning the concentrating lens array 420.

After completing assembling the concentrator photovoltaic module using the above alignment method for concentrator photovoltaic module, when the sunlight illuminates, the light can be deflected using the array-type concentrating lens 420 and focused on the plurality of photovoltaic receivers 430 for generating current. In addition, it is not required to reserve optically inactive regions on the array-type concentrating lens 420. Thereby, all incident light to the concentrator photovoltaic module can be concentrated on the plurality of photovoltaic receivers 430. Compared with the technology according to the prior art, the area of the concentrator photovoltaic module for absorbing the sunlight is increased.

To sum up, the present invention discloses a concentrator photovoltaic module and the alignment device and method thereof. According to the pre-calculated tilt angle, the laser source is disposed obliquely on the top surface of the alignment device. According to the pre-calculated first and second alignment coordinates, the first and second optical alignment points are disposed on the circuit board. Besides, the first and second laser receivers can be further disposed on the circuit board. By using the oblique and deflected laser source, optical alignment of the circuit board and the concentrating lens can be performed directly. Thereby, it is not required to dispose optically inactive regions for the concentrator photovoltaic module. Then the utilization of the sunlight can be increased, which, in turn, improves the output power efficiency and benefits the performance of concentrator photovoltaic modules.

Accordingly, the present invention conforms to the legal requirements owing to its novelty, nonobviousness, and utility. However, the foregoing description is only embodiments of the present invention, not used to limit the scope and range of the present invention. Those equivalent changes or modifications made according to the shape, structure, feature, or spirit described in the claims of the present invention are included in the appended claims of the present invention.

What is claimed is:

1. An alignment method for a concentrator photovoltaic module, said concentrator photovoltaic module comprising a photovoltaic module frame, a circuit board disposed at a bottom of said photovoltaic module frame and further including a solar cell, a concentrating lens disposed on a top of said photovoltaic module frame and parallel with said circuit board, comprising steps of:

disposing said photovoltaic module frame inside an accommodating space of an alignment device;

disposing said circuit board at the bottom of said photovoltaic module frame;

disposing a laser source at said alignment device at a tilt angle, illuminating said circuit board using said laser source, adjusting a position of said circuit board, and observing and ensuring that a spot of said laser source falls at a first optical alignment point;

disposing said concentrating lens on the top of said photovoltaic module frame;

using said laser source again to illuminate said concentrating lens, adjusting a position of said concentrating lens, and observing and ensuring that the spot of said laser source falls at a second optical alignment point; and completing assembling said concentrator photovoltaic module.

2. The alignment method for said concentrator photovoltaic module of claim 1, wherein said concentrating lens is a plano-convex lens, a biconvex lens, a paraboloidal lens, or a Fresnel lens.

3. The alignment method for said concentrator photovoltaic module of claim 1, wherein a length of a concentrating region of said concentrating lens and a length of the top of said photovoltaic module frame are identical.

4. The alignment method for said concentrator photovoltaic module of claim 1, and before said step of disposing said photovoltaic module frame, further comprising a step of setting a first alignment coordinate and a second coordinate according to a curvature of said concentrating lens and a position of said solar cell to give a first alignment coordinate and a second coordinate acting as said first optical alignment point and said second optical alignment point, respectively.

5. The alignment method for said concentrator photovoltaic module of claim 4, and before said step of disposing said photovoltaic module frame, further comprising a step of disposing a first laser receiver and a second laser receiver on said circuit board according to said first alignment coordinate and said second alignment coordinate.

6. The alignment method for said concentrator photovoltaic module of claim 5, and further illuminating said circuit board and said concentrating lens using said laser source, and said first laser receiver and said second laser receiver receiving signals for optical alignment of said circuit board and said concentrating lens.

* * * * *